United States Patent [19]

Brannon et al.

[11] Patent Number: 5,311,146
[45] Date of Patent: May 10, 1994

[54] CURRENT MIRROR FOR LOW SUPPLY VOLTAGE OPERATION

[75] Inventors: Craig M. Brannon, St. Louis Park; Tuan V. Ngo, Eden Prairie; John J. Price, Jr., Edina, all of Minn.

[73] Assignee: VTC Inc., Bloomington, Minn.

[21] Appl. No.: 9,287

[22] Filed: Jan. 26, 1993

[51] Int. Cl.[5] .............................................. H03F 3/04
[52] U.S. Cl. ..................................... 330/288; 323/315
[58] Field of Search ................ 330/288; 323/315, 316, 323/317

[56] References Cited

U.S. PATENT DOCUMENTS

| | | | |
|---|---|---|---|
| 3,863,169 | 1/1975 | Knight | 330/22 |
| 3,870,965 | 3/1975 | Frederiksen | 330/30 R |
| 4,329,639 | 5/1982 | Davis | 323/315 |
| 4,380,740 | 4/1983 | Kaplan | 330/288 |
| 4,409,558 | 10/1983 | Knijnenburg et al. | 330/288 |
| 4,412,186 | 10/1983 | Nagano | 330/288 |
| 4,462,005 | 7/1984 | Kusakabe et al. | 330/288 |
| 4,700,144 | 10/1987 | Thomson | 330/257 |
| 4,730,124 | 3/1988 | Metz | 307/255 |
| 4,766,367 | 8/1988 | Saller et al. | 323/315 |
| 4,801,892 | 1/1989 | Yamakoshi et al. | 330/288 |
| 4,814,724 | 3/1989 | Tanigawa | 330/288 |
| 4,857,864 | 8/1989 | Tanaka et al. | 330/288 |
| 4,882,548 | 11/1989 | Marrah et al. | 330/288 |
| 4,937,515 | 6/1990 | Yoshino | 323/315 |
| 4,947,103 | 8/1990 | Abdi et al. | 323/316 |
| 5,057,792 | 10/1991 | Gay | 330/288 |

OTHER PUBLICATIONS

*Analogue IC Design: The Current-Mode Approach*, edited by C. Toumazou, F. J. Lidgey and D. G. Haigh, copyright 1990 by Peter Peregrinus Ltd., published on behalf of the Institution of Electrical Engineers, pp. 250–285.

*Primary Examiner*—James B. Mullins
*Attorney, Agent, or Firm*—Kinney & Lange

[57] ABSTRACT

The present invention is an improved current mirror circuit. This improved current mirror circuit includes first and second transistors of the same conductivity type and have bases connected together. The first transistor is connected between a first supply terminal and an input terminal. The second transistor is connected between a first supply terminal and an output terminal. Included is a feedback circuit for providing a voltage feedback between the input terminal and the bases of the first and second transistors. Also included is a bias circuit for providing a bias current to the feedback circuit that is based on the input current.

25 Claims, 2 Drawing Sheets

CURRENT MIRROR FOR LOW SUPPLY VOLTAGE OPERATION

BACKGROUND OF THE INVENTION

The present invention relates to a current mirror circuit and, more particularly, to a current mirror circuit that is suited for use with a low supply voltage and is capable of maintaining a current ratio accuracy over a wide range of mirror ratios and input currents.

Current mirrors are often used in electronic circuits to provide an output current that is related to an input current. The output current may be identical to the input current or may be a fixed ratio of the input current as is the case of a current gain or current reduction block. In addition, the input current to the current mirror may be fixed and remain constant or may be variable. An important characteristic of a current mirror for good dynamic performance is to maintain a linear relationship between the input current and the output current over a wide range of input currents and mirror ratios.

A characteristic that is especially important for current mirrors that are for use with low supply voltages is the voltage compliance for each of the input and output terminals. The voltage compliance of the input and output terminals is the range of voltages at each of the input and output terminals for which the current mirror provides an accurate mirror ratio. To maximize the voltage compliance of the input and output terminals of the current mirror, the voltage drop between a supply terminal and each of the input terminal and the output terminal should be minimized. For example, the supply voltage for the current mirror must be greater than or equal to the sum of the input voltage across an external input current source and the voltage between the input terminal and the supply terminal. The external input current source is connected between a reference terminal, or ground terminal, and the input terminal. Therefore, for low supply voltage operation, it is necessary that the voltage drop between the input terminal and the supply terminal be minimized so that either maximum voltage compliance at the input terminal or maximum "headroom" can be provided. The headroom is the difference between the supply voltage and the sum of the input voltage across the external input current source and the voltage between the input terminal and the supply terminal. In a similar manner, it is necessary that the voltage drop between the output terminal and the supply terminal be minimized to provide maximum voltage compliance at the output terminal or to provide maximum headroom between the output terminal and a reference terminal or ground terminal.

There is a present need for a current mirror circuit that provides a relatively low voltage drop between the supply terminal and both input and output terminals of the current mirror thereby allowing the supply voltage to be reduced without reducing either the input voltage or the headroom. In addition, this current mirror should provide a mirror ratio that is accurate over a wide range of mirror ratios. Furthermore, the current mirror should maintain linearity over a wide range of input currents.

SUMMARY OF THE INVENTION

The present invention is an improved current mirror circuit that includes an input terminal having an input current and an input voltage associated therewith, an output terminal having an output terminal associated therewith, a first supply terminal and a second supply terminal.

Included in the improved current mirror are first and second transistors of the same conductivity type having bases connected together. The first transistor is connected between the first supply terminal and the input terminal, and the second transistor is connected between the first supply terminal and the output terminal.

Included in the improved current mirror is a feedback means including third and fourth transistors of different conductivity types. The third and fourth transistors are connected between the input terminal and the bases of the first and second transistors for providing feedback therebetween. A bias current means provides bias current to the feedback means based on the input current.

In one preferred embodiment, the feedback means includes a third transistor having a control terminal and a pair of controlled terminals. The controlled terminals are connected between the first and second supply terminals, and the control terminal is connected to the input terminal. In this preferred embodiment, the bias current means is a current mirror bias circuit for providing bias current in the third transistor based on input current.

DETAILED DESCRIPTION OF THE PREFERRED EMBODIMENTS

Figure 1:
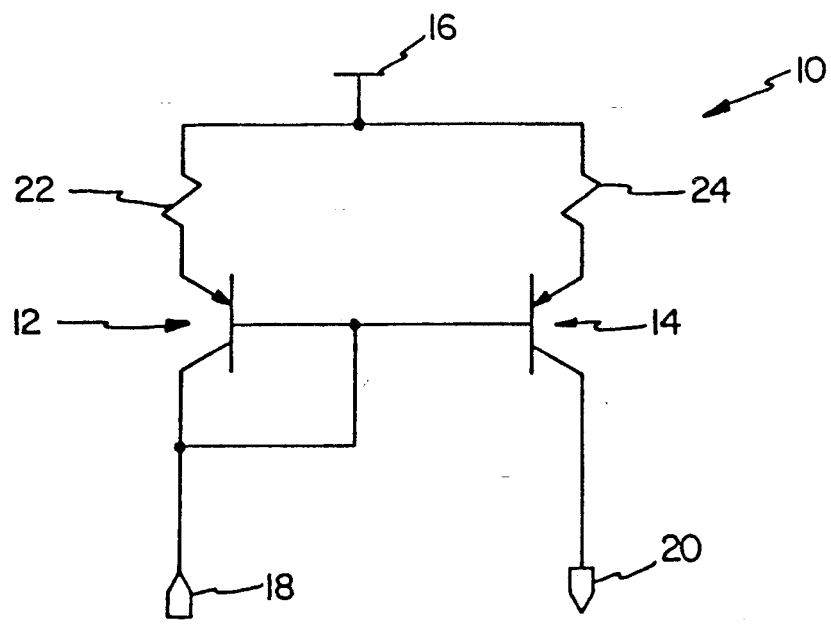
FIG. 1 is a schematic diagram of a conventional two-transistor current mirror.

Before discussing an improved current mirror of the present invention, a review of three typical prior art current mirrors will be helpful. FIG. 1 shows a simple two-transistor current mirror 10 that is known. The current mirror 10 includes a pair of transistors 12 and 14 that have their bases connected together, with transistor 12 connected between a first supply terminal 16 and an input terminal 18, and with the second transistor 14 connected between the first supply terminal 16 and an output terminal 20. Degeneration resistors 22 and 24 are connected between the first supply terminal 16 and the first and second transistors 12 and 14, respectively.

Transistor 12 is connected as a diode with the base connected to the collector. A current passing between a common reference terminal (not shown) and the input terminal 18 is herein referred to as an input current designated $I_{IN}$. A current passing between the common reference terminal and the output terminal 20 is herein referred to as an output current designated $I_{OUT}$. The relationship between the input current, $I_{IN}$, and output current, $I_{OUT}$, is determined by a conventional current scaling technique.

A transfer function, or mirror ratio, herein designated as M, that is representative of the output current, designated as $I_{OUT}$, divided by the input current, designated as $I_{IN}$, can be derived to characterize current mirror 10. As is known in the art, the mirror ratio of current mirror 10 can be represented by the following equation:

$$M = \frac{I_{OUT}}{I_{IN}} = \frac{N}{1 + (1 + N)/\beta_0}$$ Equation No. 1 where N represents the ratio of resistances of resistors 22 and 24 for the case where current scaling resistors are used. N represents the ratio of the two emitterbase junction areas of transistors 12 and 14 for the case where scaled emitter-base junction areas are used. For the case where a combination of scaling resistors and scaled emitter areas are used, N represents a combination of these ratios. In Equation 1, $\beta_0$ represents the ratio of collector current to base current for each of the transistors 12 and 14.

The current mirror 10 has several drawbacks. The mirror ratio given by Equation 1 is in error as a result of the base currents of transistor 12 and transistor 14 that subtract from the input current, $I_{IN}$. In addition, the mirror ratio given by Equation 1 includes a $\beta_0$ term that in general is both temperature dependent and varies in a non-linear manner with the base current. Furthermore, the most accurate mirror ratio occurs when large voltages are dropped across the degeneration resistors 22 and 24.

The maximum input voltage at the input terminal 18 is equal to the supply voltage minus the voltage drop across degeneration resistor 22 minus the base-to-emitter voltage of transistor 12. Similarly, the maximum output voltage at the output terminal 20 is equal to the supply voltage minus the voltage drop across degeneration resistor 24 minus the emitter to collector saturation voltage of transistor 14. Therefore, improving the mirror ratio by dropping large voltages across degeneration resistors 22 and 24 reduces the maximum input and output voltages that can be accommodated at the input terminal 18 and the output terminal 20, respectively.

Figure 2:
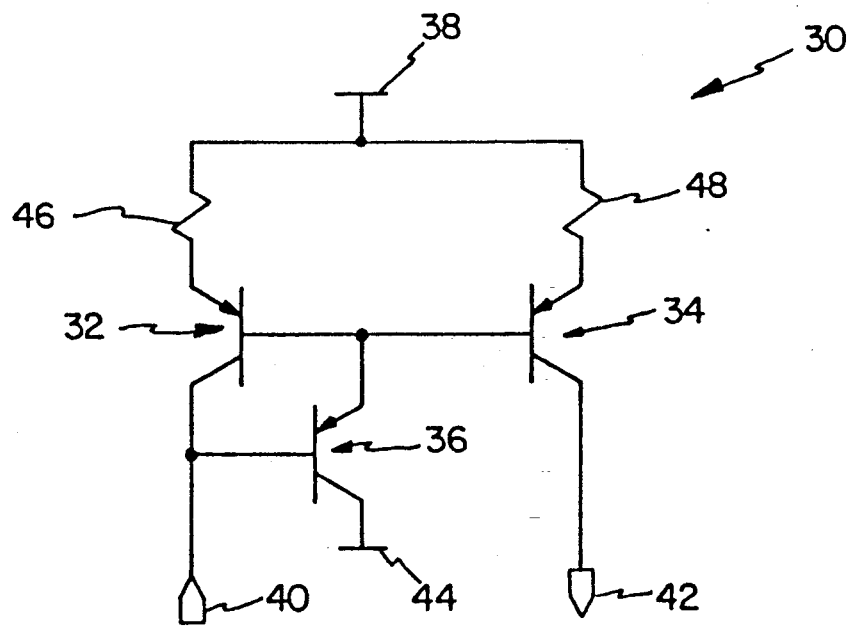
FIG. 2 is a schematic diagram of a conventional three-transistor current mirror.

FIG. 2 shows a three-transistor current mirror 30 that is known. The current mirror 30 includes transistors 32, 34 and 36 with the bases of transistors 32 and 34, and the emitter of transistor 36, connected together. Transistor 32 is connected between a first supply terminal 38 and an input terminal 40, and transistor 34 is connected between the first supply terminal 38 and an output terminal 42. Transistor 36 is connected between the bases of transistors 32 and 34 and a second supply terminal 44. First and second degeneration resistors 46 and 48 are connected between the first supply terminal 38 and an emitter of transistors 32 and 34, respectively.

A current passing between a common reference terminal (not shown) and the input terminal 40 is referred to as an input current designated as $I_{IN}$. A current passing between the common reference terminal and the output terminal 42 is referred to as an output current designated $I_{OUT}$. The relationship between the input current, $I_{IN}$, and the output current, $I_{OUT}$, is determined by a conventional current scaling technique.

The current mirror 30 can be characterized by a current mirror ratio M that is equal to the output current $I_{OUT}$ divided by the input current $I_{IN}$. The current mirror ratio M for current mirror 30 can be represented by the following equation:

$$M = \frac{I_{OUT}}{I_{IN}} = \frac{N}{1 + \left(\frac{1}{\beta_{32}} + \frac{N}{\beta_{34}}\right)\frac{1}{\beta_{36}}}$$ Equation No. 2 where N represents either the ratio of resistances for resistors 46 and 48 for the case where current scaling resistors are used, or N represents the ratio of the emitter-base junction areas for transistors 32 and 34 for the case where scaled emitter-base junction areas are used. In Equation 2, $\beta_{32}$, represents the ratio of the collector current divided by the base current for transistor 32, $\beta_{34}$ represents the collector current divided by the base current of transistor 34, and $\beta_{36}$ represents the collector current divided by the base current of transistor 36.

As can be seen from Equation 2, the current mirror 30 provides improved mirror ratio accuracy by reducing the dependence on $\beta_{32}$, $\beta_{34}$ and $\beta_{36}$ for transistors 32, 34 and 36, respectively. However, the maximum input voltage at the input terminal 40 is equal to the supply voltage applied between the first and second supply terminals 44 and 38 minus the voltage drop across degeneration resistor 46 minus the base-to-emitter voltage drop across transistor 32 minus the base-to-emitter voltage drop across transistor 36. Therefore, the supply voltage must be at least one diode drop greater than the supply voltage required by current mirror 10 shown in FIG. 1 for the same input voltage at the input terminal 40.

Figure 3:
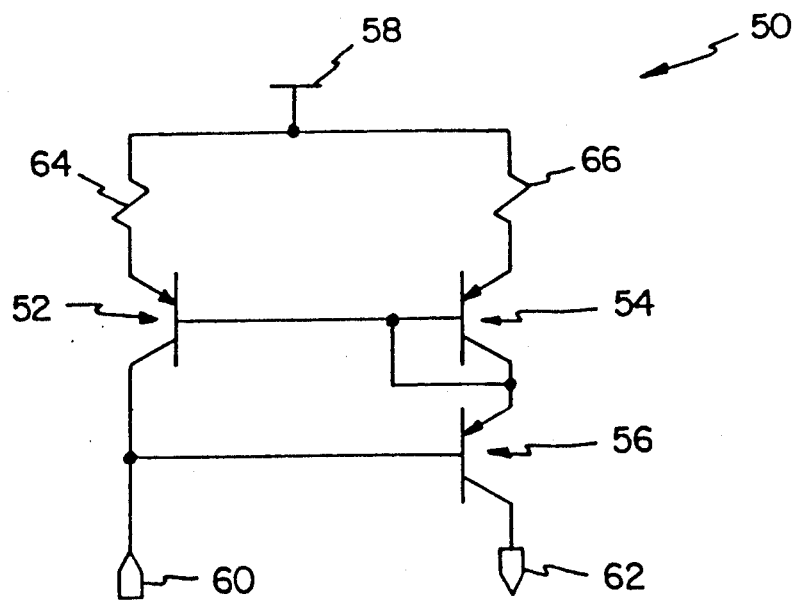
FIG. 3 is a schematic diagram of a Wilson current mirror.

Shown in FIG. 3 is a three-transistor current mirror 50 commonly referred to as a Wilson current mirror circuit. The current mirror 50 includes transistors 52, 54 and 56. The bases of transistors 52 and 54 and the emitter of transistor 56 are connected together. Transistor 52 is connected between the first supply terminal 58 and the input terminal 60. Transistor 54 is connected between a first supply terminal 58 and an output terminal 62 with the base connected to the collector thereby forming a diode between the fist supply terminal 58 and the output terminal 62. Transistor 56 is connected between transistor 54 and the output terminal 62. The base of transistor 56 is connected to the input terminal 60. Degeneration resistors 64 and 66 are connected between the first supply terminal 58 and transistor 52 and transistor 54, respectively.

A current passing between a common reference terminal (not shown) and the input terminal 60 is referred to as an input current designated $I_{IN}$. A current passing between the common reference terminal and the output terminal 62 is referred to as the output current and designated $I_{OUT}$. The current mirror 50 can be characterized by a transfer function or mirror ratio M representing the output current divided by the input current. The transfer function or mirror ratio for current mirror 50 can be represented by the following equation:

$$M = \frac{I_{OUT}}{I_{IN}} = \left[1 - \frac{2}{\beta^2 + 2\beta + 2}\right] \approx \left[1 - \frac{2}{\beta^2}\right]$$ Equation No. 3

In Equation 3, it is assumed that $\beta$, the ratio of collector current to base current, for each of transistors 52, 54 and 56 are identical. In addition, it is assumed in Equation 3 that transistors 52, 54 and 56 are identical and therefore have matched emitter-base junction areas. Equation 3 further assumes that resistors 64 and 66 are matched and have identical resistances. The mirror ratio M will be affected by any mismatch in emitter-base junction areas and any mismatch in resistance of resistors 64 and 66.

It can be seen from Equation 3 that when $\beta$ is large, the term $1-2/\beta^2$ is very close to one. However, a source of error is present due to variations in resistance values for resistors 64 and 66.

In addition, the maximum input voltage at the input terminal 60 is equal to the supply voltage that is applied between the first supply terminal 58 and the common reference terminal, minus the voltage drop across degeneration resistor 64, minus the emitter-to-base voltage of transistor 52, minus the emitter-to-base voltage of transistor 56. Therefore, the supply voltage must be at least one diode drop greater than the supply voltage required by current mirror 10 for the same input voltage.

The maximum output voltage at the output of terminal 62 is equal to the supply voltage minus the voltage drop across degeneration resistor 66 minus the base-emitter voltage of transistor 54 minus the emitter-to-collector saturation voltage of transistor 56. Therefore, the supply voltage for current mirror 50 must at least be greater by the emitter-to-base saturation voltage of transistor 54 than the supply voltage required by current mirror 10 for the same output voltage. In addition, the accuracy of the mirror ratio M given in Equation 3 is only good with a 1:1 mirror ratio. For these reasons, the current mirror 50 is not well suited for low voltage operation.

Prior art current mirror circuits and their characteristics are described, for example, in *Analog IC Design: The Current Mode Approach*, edited by C. Ioumazou, F.J. Lidgey and D.G. Haigh, published in 1990 by Peter Peregrinus Ltd. on behalf of the Institution of Electrical Engineers, incorporated herein by reference.

Figure 4:
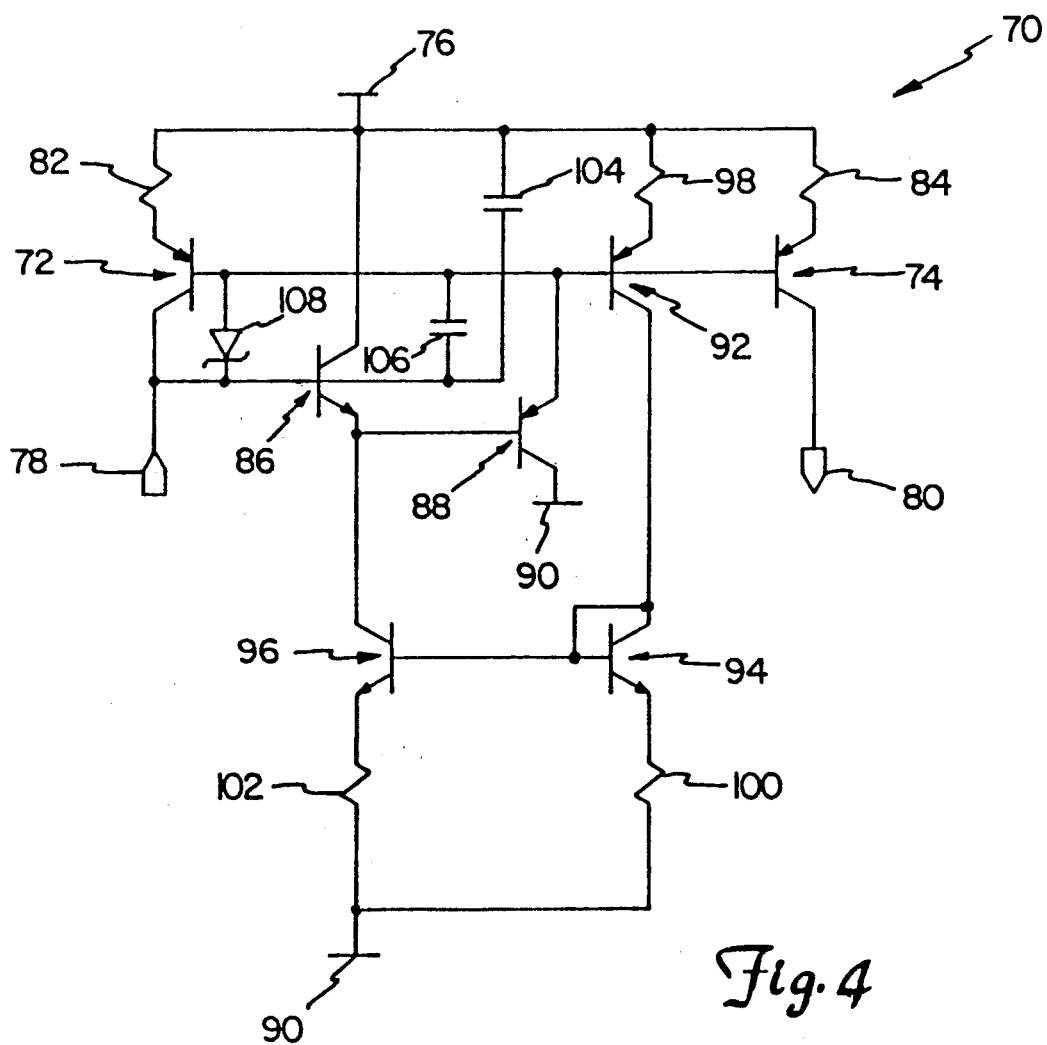
FIG. 4 is a schematic diagram of an improved current mirror of the present invention.

FIG. 4 is a schematic diagram of the improved current mirror circuit 70 of the present invention. Current mirror 70 includes transistor 72 and transistor 74 having bases connected together. Transistor 72 is connected between a first supply terminal 76 and an input terminal 78. Transistor 74 is connected between the first supply terminal 76 and an output terminal 80. Degeneration resistors 82 and 84 are connected between the first supply terminal 76 and transistor 72 and transistor 74, respectively.

An input current at input terminal 78, referred to as $I_{IN}$, is mirrored by transistors 72 and 74 to provide an output current, referred to as $I_{OUT}$, at output terminal 80. An emitter current in transistor 72 produces an emitter current in transistor 74 that is related by a mirror ratio. This mirror ratio is established by conventional current scaling techniques. In one preferred embodiment, this mirror ratio is determined by emitter base junction areas of transistors 72 and 74, and resistance values for degeneration resistors 82 and 84. For this preferred embodiment, the emitter base junction areas of transistors 72 and 74 and resistance values for degeneration resistors 82 and 84 are selected so that emitter currents of transistors 72 and 74 are substantially the same thereby forming the mirror ratio that is substantially equal to one.

Alternatively, the mirror ratio can be established by the ratio of emitter base junction areas for transistors 72 and 74 alone. For this case, the degeneration resistor 82 and 84 are eliminated and each of the emitters of transistors 72 and 74 are connected to the first supply terminal 76.

Included in current mirror 70 is a feedback circuit for providing feedback between the input terminal 78 and the bases of transistors 72 and 74. In one preferred embodiment, the feedback circuit provides unity gain voltage feedback from the input terminal 78 to the bases of transistors 72 and 74. Transistor 86 is connected between the first supply terminal 76 and a second supply terminal 90 with the base connected to the input terminal 78. Transistor 88 is connected between the second supply terminal 90 and the bases of transistors 72 and 74. The base of transistor 88 is connected to the emitter of transistor 86.

The feedback circuit comprises transistors 86 and 88. A voltage at the input terminal 78 is maintained substantially the same as a voltage at the bases of transistors 72 and 74 by the feedback circuit. A bias current is provided to transistor 86 to establish an operating point. The bias current is provided by a current mirror bias circuit that will be described later. The emitter voltage of transistor 86 tends to follow or track the base voltage of transistor 86. Similarly, the emitter voltage of transistor 88 tends to follow or track the base voltage of transistor 88. Because the emitter of transistor 86 is connected to the base of transistor 88, the emitter voltage of transistor 88 tends to follow or track the base voltage of transistor 86. Therefore, the voltage at the bases of transistors 72 and 74 that are connected to the emitter of transistor 88 tends to follow or track the voltage at the input terminal 78 that is connected to the base of transistor 86.

Reduction of the voltage at the input terminal 78 produces a corresponding reduction of the voltage at the bases of transistors 72 and 74 as a result of the feedback circuit. If the voltage at the bases of transistor 72 and 74 becomes sufficiently small so that the emitter base junction of transistors 72 and 74 is forward biased, a current between the emitter and collector of transistors 72 and 74 is established. Transistor 88 conducts to provide a current sink for base current established in transistors 72 and 74. A collector current established in transistor 72 corresponds to the input current $I_{IN}$ and a collector current established in transistor 74 corresponds to the output current $I_{OUT}$, with $I_{IN}$ being related to $I_{OUT}$ by the mirror ratio.

An important characteristic of the feedback circuit is that the voltage drop between the first supply terminal 76 and the input terminal 78 is minimized. Minimizing this voltage maximizes the headroom thereby allowing low supply voltage operation of the current mirror 70. In the preferred embodiment, transistors 86 and 88 that form the feedback circuit provide a voltage drop between the input terminal 78 and the bases of transistor 72 and 74 that is substantially equal to zero. The voltage drop across the forward biased base-emitter junction of transistor 86 is substantially cancelled out by the voltage drop across the forward biased base-emitter junction of transistor 88. Therefore, in the preferred embodiment, the voltage drop between the input terminal 78 and the first supply terminal is equal to the voltage drop across the forward biased base-emitter junction of transistor 72 plus a voltage drop across resistor 82. The voltage drop across resistor 82 will generally be small relative to the voltage drop across the base-emitter junction of transistor 72.

The current mirror 70 includes a bias circuit for providing bias to the feedback circuit that is based on the input current $I_{IN}$. In this manner, proper bias is maintained for the feedback circuit over a wide range of input currents $I_{IN}$. Furthermore, providing bias compensation based on the input current $I_{IN}$ improves the linearity of the input current $I_{IN}$ and output current $I_{OUT}$ relationship.

In one preferred embodiment, the bias circuit provides bias to the feedback circuit that is based on the collector current of transistor 72. For this embodiment, the bias circuit for current mirror 70 includes transistors 92, 94 and 96 and resistors 98, 100 and 102. Transistor 92 has a base that is connected to each of the bases of transistors 72 and 74. Transistor 94 is connected to form an diode with the collector connected to the base forming an anode and the emitter forming a cathode. The transistor 94 is connected between transistor 92 and the second supply terminal 90 with the collector and base of transistor 94 connected to the collector of transistor 92. Resistor 98 is connected between the first supply terminal 76 and the emitter of transistor 92. Resistor 100 is connected between the second supply terminal 90 and the emitter of transistor 94. Transistor 96 is connected between the emitter of transistor 86 and the second supply terminal 90, with resistor 102 connected between transistor 96 and the second supply terminal 90. The base of transistor 96 is connected to the base of transistor 94.

The current mirror bias circuit of the preferred embodiment provides a bias current in transistor 86 that is related to the collector current in transistor 72. Transistor 92 is connected to the base of transistor 72. The emitter current of transistor 92 is related to the emitter current of transistor 72 in a similar manner as the emitter current relationship between transistors 72 and 74. Therefore, the emitter-base junction areas for transistors 72 and 92, and resistance values for degeneration resistors 82 and 98, are selected so that a desired ratio of emitter currents in transistors 72 and 92 is achieved.

The input current, $I_{IN}$, at the input terminal 78 results in an emitter current in transistor 72. This emitter current in transistor 72 produces an emitter current in transistor 92 that is related by the desired current ratio of emitter currents in transistors 72 and 92. In one preferred embodiment, the emitter current of transistor 72 is much greater than the emitter current of transistor 92.

This emitter current in transistor 92 produces a collector current in transistor 72 that is related to a collector current in transistor 96 by a current ratio. This current ratio between collector currents of transistors 92 and 96 is related in a similar manner to the emitter current ratios between transistors 72, 92 and 74, previously discussed. This ratio of collector currents between transistors 94 and 96 is established by a ratio of emitter-base junction areas for transistors 94 and 96, and a ratio of resistance values for resistors 100 and 102.

In one preferred embodiment, the emitter-base junction areas for transistors 94 and 96 are substantially the same and the resistance values for resistors 100 and 102 are also substantially the same. For this preferred embodiment, the collector current for transistor 92 is substantially the same as the collector current of transistor 96 and therefore the current ratio is equal to one.

The emitter current of transistor 72 is mirrored by transistors 92, 94 and 96 to provide an emitter current in transistor 86 that is related to the collector current in transistor 72. In this manner, the bias or operating point of transistor 86 is varied based on the input current at input terminal 78. The variation in the operating point of transistor 86 produces a variation in the feedback provided by transistors 86 and 88 based on the input current at input terminal 78. This variation in feedback tends to provide a more linear relationship between the input current $I_{IN}$ and the output current $I_{OUT}$, thereby improving the linearity of current mirror 70.

In one preferred embodiment, capacitors 104 and 106 are included in current mirror 70 to provide compensation for the feedback circuit to maintain stability of the current mirror 70 at high frequency. Capacitor 104 is connected between the base of transistor 86 and the first supply terminal 76. Capacitor 106 is connected between the base of transistor 86 and the base of transistor 72.

In one preferred embodiment, current mirror 70 includes a Schottky diode 108 that is connected between the base of transistor 72 and the input terminal 78. The Schottky diode 108 provides current to the base of transistors 72, 74 and 92 during the application of the supply voltage to the first and second supply voltage terminals 76 and 90. Current conducted from Schottky diode 108 biases transistor 92 thereby insuring proper startup of current mirror 70. Once the supply voltage across the first and second supply terminals 76 and 90 is stabilized and the voltage between the collector of transistor 72 and the second supply terminal 90 is substantially equal to the voltage between the base of transistor 72 and the second supply terminal 90, the Schottky diode 108 no longer conducts current and remains off or nonconducting during the regular circuit operation.

The input and output voltages are defined as the voltages between the second supply terminal 90 and the input terminal 78, and the voltage between the second supply terminal 90 and the output terminal 80, respectively. The maximum input voltage is equal to the supply voltage minus the voltage drop across resistor 82 minus the base-to-emitter voltage of transistor 72. In one preferred embodiment, the voltage drop across resistor 82 is 0.2 volt and the typical base-to-emitter voltage of transistor 72 is 0.8 volt. Therefore, for this preferred embodiment, the maximum input voltage is approximately the supply voltage minus one volt.

The maximum output voltage for current mirror 70 is equal to the supply voltage minus the voltage drop across resistor 84 minus the emitter-to-collector saturation voltage of transistor 74. In one preferred embodiment, the voltage drop across resistor 84 is typically 0.2 volt and the emitter-to-collector saturation voltage of transistor 74 is typically 0.4 volt. Therefore, for this preferred embodiment, the maximum output voltage is equal to the supply voltage minus approximately 0.6 volt.

In operation, an input current, $I_{IN}$, provided at input terminal 78 provides an output current, $I_{OUT}$, at output terminal 80. The output current $I_{OUT}$ is related to the input current by a mirror ratio. The feedback circuit provides feedback between the input terminal and the bases of transistors 72 and 74. The feedback circuit is biased by the bias circuit that provides a bias current that is related to the input current $I_{IN}$. Changes in the input current $I_{IN}$ produce changes in the bias current provided to the feedback circuit to maintain a linear relationship between input and output currents over a wide range of input currents. In this manner, the feedback circuit and the bias circuit maximize the voltage compliance of the input terminal 78 and the output terminal 80.

Although the present invention has been described with reference to preferred embodiments, workers skilled in the art will recognize that changes may be made in form and detail without departing from the spirit and scope of the invention.

What is claimed is:

1. An improved current mirror circuit comprising:

an input terminal having an input current and an input voltage associated therewith;

an output terminal having an output current associated therewith;

first and second supply terminals;

first and second transistors of the same conductivity type having bases connected together with the first transistor being connected between the first supply terminal and the input terminals, and with the second transistor being connected between the first supply terminal and the output terminal;

feedback means including third and fourth transistors of different conductivity types connected between the input terminals and the bases of the first and second transistors for providing feedback therebetween; and bias current means responsive to the input current for providing bias current to the feedback means based on the input current.

2. The improved current mirror circuit of claim 1 wherein the third transistor is connected between the first and second supply terminals with the base of the third transistor connected to the input terminal.

3. The improved current mirror circuit of claim 2 wherein the bias current means is connected to the third transistor for providing bias current thereto.

4. The improved current mirror circuit of claim 1 wherein the third transistor is connected between the first and second supply terminals and has a base connected to the input terminal, and the fourth transistor is connected between the bases of the first and second transistors and the second supply terminal and has a base connected to the emitter of the third transistor.

5. The improved current mirror circuit of claim 1 wherein the bias current means is a current mirror circuit that provides bias current that is related to a current in the first transistor.

6. The improved current mirror circuit of claim 1 wherein the input current passes between the input terminal and the second supply terminal and wherein a voltage between the input terminal and the first supply terminal is less than two diode drops.

7. The improved current mirror circuit of claim 1 wherein a voltage between the input terminal and the bases of the first and second transistors is less than one diode drop.

8. The improved current mirror circuit of claim 1 wherein the bias current means provides bias current to the feedback means proportional to the input current.

9. An improved current mirror circuit comprising:
an input terminal having an input current and an input voltage associated therewith;
an output terminal having an output current associated therewith;
first and second supply terminals;
first and second transistors of the same conductivity type having bases connected together with the first transistor being connected between the first supply terminal and the input terminal, and with the second transistor being connected between the first supply terminal and the output terminal;
a feedback circuit including a third transistor having a control terminal and a pair of controlled terminals with the controlled terminals being connected between the first and second supply terminals and with the control terminal connected to the input terminal; and a current mirror bias circuit for providing bias current in the third transistor based on the input current.

10. The improved current mirror circuit of claim 9 wherein the current mirror bias circuit is connected between the first and second supply terminals for providing bias current in the third transistor based on base current in the first transistor.

11. The improved current mirror circuit of claim 10 wherein the third transistor is of a first conductivity type with the feedback circuit further including a fourth transistor having a second conductivity type with the fourth transistor having a control terminal and a pair of controlled terminals and with the controlled terminals being connected between the first and second supply terminals and with the control terminal being connected to one of the controlled terminals of the third transistor.

12. The improved current mirror circuit of claim 9 wherein the input current passes between the input terminal and the second supply terminal and wherein a voltage between the input terminal and the first supply terminal is less than two diode drops.

13. An improved current mirror circuit comprising:
an input terminal;
an output terminal;
first and second supply terminals;
first and second transistors of the same conductivity type having bases connected together with the first transistor being connected between the first supply terminal and the input terminal, and with the second transistor being connected between the first supply terminal and the output terminal;
a third transistor connected between the first and second supply terminals and having a base connected to the input terminal;
a fourth transistor connected between the bases of the first and second transistors and the second supply terminal and having a base connected to an emitter of the third transistor; and
current mirror means for providing a current in the third transistor based on current in the first transistor.

14. The improved current mirror circuit of claim 13 wherein the first and second transistors are PNP transistors.

15. The improved current mirror circuit of claim 13 wherein the third transistor is an NPN transistor having a collector connected to the first supply terminal and an emitter connected to the current mirror means.

16. The improved current mirror circuit of claim 13 further including a diode having a cathode connected to the input terminal and an anode connected to the base of the first transistor.

17. The improved current mirror circuit of claim 13 further including a first resistor connected between the first supply terminal and the first transistor.

18. The improved current mirror circuit of claim 13 further including a second resistor connected between the first supply terminal and the second transistor.

19. The improved current mirror circuit of claim 13 wherein the current mirror means further includes:
a fifth transistor connected between the first and second supply terminals and having a base connected to the base of the first transistor;
a sixth transistor connected between the second supply terminal and the fifth transistor with the collector and the base of the sixth transistor connected together; and a seventh transistor connected between the second supply terminal and the third transistor and having a base connected to the base of the sixth transistor.

20. The current mirror means of claim 19 and further including a first resistor connected between the fifth transistor and the first supply terminal.

21. The current mirror means of claim 19 and further including a resistor connected between the second supply terminal and the sixth transistor.

22. The current mirror means of claim 19 and further including a resistor connected between the second supply terminal and the seventh transistor.

23. The improved current mirror circuit of claim 13 and further including a first capacitor connected between the input terminal and the base of the first transistor.

24. The improved current mirror circuit of claim 23 and further including a second capacitor connected between the input terminal and the first supply terminal.

25. The improved current mirror circuit of claim 13 wherein the input current passes between the input terminal and the second supply terminal and wherein a voltage between the input terminal and the first supply terminal is less than two diode drops.

* * * * *

UNITED STATES PATENT AND TRADEMARK OFFICE
CERTIFICATE OF CORRECTION

PATENT NO. : 5,311,146

DATED : May 10, 1994

INVENTOR(S) : CRAIG M. BRANNON, TUAN V. NGO, JOHN J. PRICE, JR.

It is certified that error appears in the above-indentified patent and that said Letters Patent is hereby corrected as shown below:

Col. 9, line 9, delete "terminals", insert --terminal--

Col. 9, line 14, delete "terminals", insert --terminal--

Signed and Sealed this

Twentieth Day of September, 1994

Attest:

BRUCE LEHMAN

Attesting Officer    Commissioner of Patents and Trademarks